(12) United States Patent
Aram

(10) Patent No.: US 6,259,307 B1
(45) Date of Patent: Jul. 10, 2001

(54) TEMPERATURE COMPENSATED VOLTAGE GAIN STAGE

(75) Inventor: Farbod Aram, Santa Clara, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/172,756

(22) Filed: Oct. 14, 1998

(51) Int. Cl.[7] ................................................ H01L 35/00
(52) U.S. Cl. ........................ 327/513; 323/312; 327/538
(58) Field of Search .................................... 327/512, 513, 327/538, 542, 359; 323/312, 313

(56) References Cited

U.S. PATENT DOCUMENTS

| | | | |
|---|---|---|---|
| 4,220,877 | * | 9/1980 | Giordano ............................... 327/378 |
| 4,282,477 | * | 8/1981 | Ahmed ................................... 323/312 |
| 5,030,924 | * | 7/1991 | Fritz ...................................... 330/256 |
| 5,034,626 | * | 7/1991 | Pirez et al. ............................ 327/542 |
| 5,404,058 | * | 4/1995 | Nishijima ............................... 327/332 |
| 5,896,063 | * | 4/1999 | Marsh et al. .......................... 330/254 |
| 5,900,772 | * | 5/1999 | Somerville et al. .................. 327/539 |
| 5,977,760 | * | 11/1999 | Kimura ................................. 323/316 |
| 5,990,727 | * | 11/1999 | Kimura ................................. 327/513 |
| 6,020,786 | * | 2/2000 | Ashby ................................... 330/256 |

* cited by examiner

*Primary Examiner*—Toan Tran
*Assistant Examiner*—Hai L. Nguyen
(74) *Attorney, Agent, or Firm*—W. Daniel Swayze, Jr.; W. James Brady; Frederick J. Telecky, Jr.

(57) ABSTRACT

A temperature compensated voltage gain stage (50) has a first current path, including a first bipolar transistor (12), a first load resistor (16), and a first PTAT current source (20) connected in series, and a second current path including a second bipolar transistor (14), a second load resistor (18), and a second PTAT current source (22) connected in series. A third resistor (24,26) is connected between the first and second current paths. First and second current sources (52,54) having a negative current to temperature relationship are connected to supply current to respective the first and second current paths in proportion to temperature induced current changes in the first and second current paths. As a consequence, a band-gap voltage is developed across the load resistors (16,18), providing for an output from the gain state that is essentially temperature independent.

7 Claims, 2 Drawing Sheets

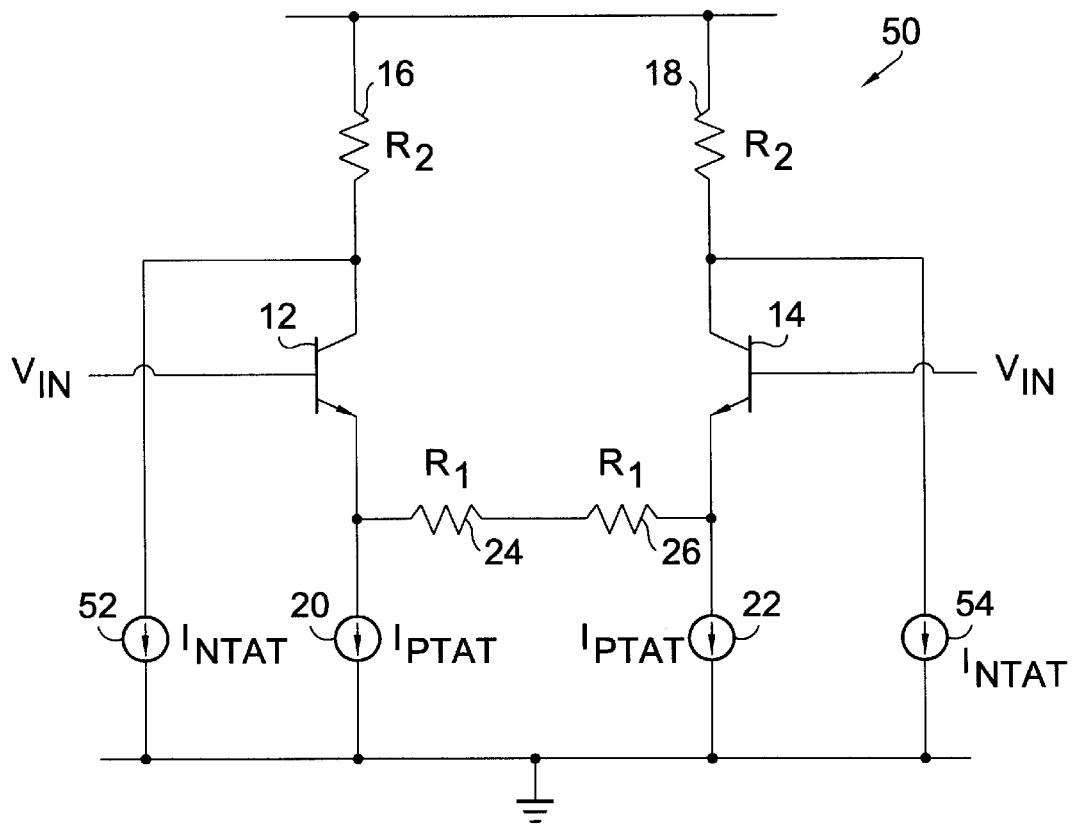
FIG. 3
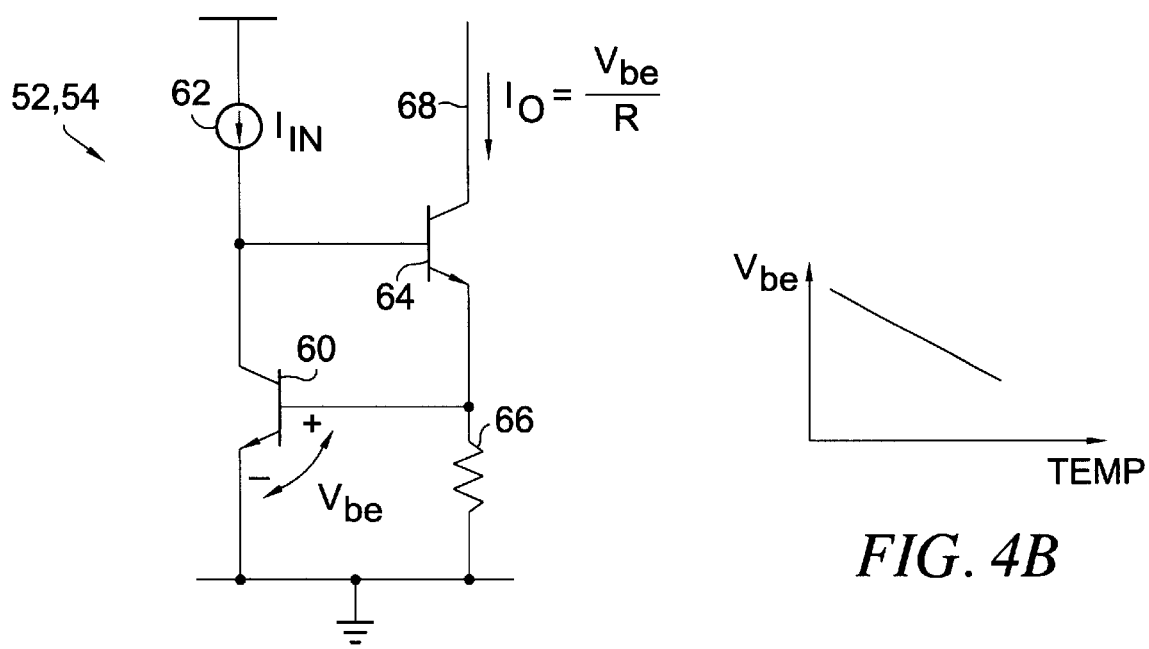
FIG. 4A
FIG. 4B ated potential, or ground. A pair of resistors, each of value $R_1$, 24 and 26 are connected between the emitters of the transistors 12 and 14. (Two resistors are shown for ease of calculation; of course, a single resistor of value $2R_1$ may be substituted therefor.) The circuit output is obtained at the collectors of the transistors 12 and 14 as differential output voltages, $V_0$, on output terminals 28 and 30.

TEMPERATURE COMPENSATED VOLTAGE GAIN STAGE

BACKGROUND OF THE INVENTION

1. Field of the Invention

This invention relates to improvements in voltage gain stages, and more particularly to improvements in temperature compensated voltage gain stages.

2. Relevant Background

Many applications exist for fast and simple differential pair gain stages, particularly for high speed applications. A typical gain stage 10 is shown in FIG. 1. The gain stage 10 includes a differential transistor pair that includes NPN transistors 12 and 14 to the respective gates of which a differential input voltage $V_{IN}$ is applied. Load resistors 16 and 18 are connected between the respective collectors of transistors 12 and 14 and a supply voltage, $V_{CC}$. The resistors 16 and 18 have a value of $R_2$.

The emitters of the transistors 12 and 14 are connected by current sources 20 and 22, respectively, to a referenced potential, or ground. A pair of resistors, each of value $R_1$, 24 and 26 are connected between the emitters of the transistors 12 and 14. (Two resistors are shown for ease of calculation; of course, a single resistor of value $2R_1$ may be substituted therefor.) The circuit output is obtained at the collectors of the transistors 12 and 14 as differential output voltages, $V_0$, on output terminals 28 and 30.

The voltage gain of the circuit is $$\frac{vo}{v_i} = \frac{R_2}{\frac{V_T}{I_T} + R_1}.$$

Since $V_T$ has a positive temperature coefficient, the overall gain of the circuit 10 is temperature dependent. One way that has been proposed to reduce the temperature dependence problem is to use a PTAT tail current source. One characteristic of the PTAT tail current source is that the current $I_T = KV_T$. However, variations in the tail current that may be provided by the PTAT tail current source may change the quiescent collector voltage of the transistors 12 and 14. As a result, variations in DC voltage drop across the load resistors $R_2$ can be troublesome if high gain is desirable.

Another way that such voltage gain stages have been temperature compensated is to attempt to provide circuitry to cancel the $V_T/I_T$ term in the gain equation set forth above. One way that has been proposed to cancel this term is by providing a cross-coupled circuit 40, as shown in FIG. 2. The circuit 40 is constructed similarly to the circuit 10 shown in FIG. 1, with corresponding parts similarly numbered, except that a pair of additional bipolar transistors 32 and 34 are provided. The transistors 32 and 34 are cross coupled, with the base of each being connected to the collector of the other. The cross-quad connectors 32 and 34 provide a transconductance $$g_m = -\frac{V_T}{I_T}$$

term in the denominator of the gain equation. This cancels the $g_m$ of transistors 12 and 14.

However, the circuit 40 has several drawbacks. Since the devices are cascaded, head-room is reduced. In addition, the dynamic range is not just limited by currents through the transistors, but is also limited by the transistors 32 and 34 as they are forward biased as the input signal increases differentially. Finally, the reactive component of the input impedance looking into the bases of input transistors 12 and 14 can be negative. Consequently, the circuit can become unstable, if it is not carefully designed.

SUMMARY OF THE INVENTION

In light of the above, therefore, it is an object of the invention to provide an improved temperature compensated voltage gain stage.

It is another object of the invention to provide a temperature compensated voltage gain stage that is suitable for high speed applications.

It is yet another object of the invention to provide a voltage gain stage of the type described that provides sufficient "head room" with regard to the voltage drop across the load resistors of the circuit.

It is yet another object of the invention to provide a voltage gain stage of the type described in which the quiescent voltage of the collectors of the differential transistor pair of the circuit exhibits little variation with temperature.

These and other objects, features and advantages of the invention will be apparent to those skilled in the art from the following detailed description of the invention, when read in conjunction with the accompanying drawings and appended claims.

According to a broad aspect of the invention, a temperature compensated voltage gain stage is provided. The gain stage has a first current path, which includes a first bipolar transistor, a first load resistor, and a first PTAT current source connected in series. It also has a second current path which includes a second bipolar transistor, a second load resistor, and a second PTAT current source connected in series. A third resistor is connected between the first and second current paths. First and second current sources having a negative current to temperature relationship are connected to supply current to respective the first and second current paths in proportion to temperature induced current changes in the first and second current paths. As a consequence, a band-gap voltage is developed across the load resistors, providing for an output from the gain state that is essentially temperature independent.

BRIEF DESCRIPTION OF THE DRAWINGS

The invention is illustrated in the accompanying drawings, in which:

FIG. 3 is an electrical schematic diagram of a voltage gain stage having current sources to supply temperature compensating current to the differential current paths, in accordance with a preferred embodiment of the present invention.

FIG. 4a is an electrical schematic diagram of an PTAT current source that can be used in practicing the invention.

FIG. 4b is a graph of $V_{be}$ vs. temperature, showing the negative relationship between the base-emitter voltage ($V_{be}$) and temperature, of the circuit of FIG. 4a.

In the various figures of the drawing, like reference numerals are used to denote like or similar parts.

DETAILED DESCRIPTION OF THE PREFERRED EMBODIMENTS

Figure 1:
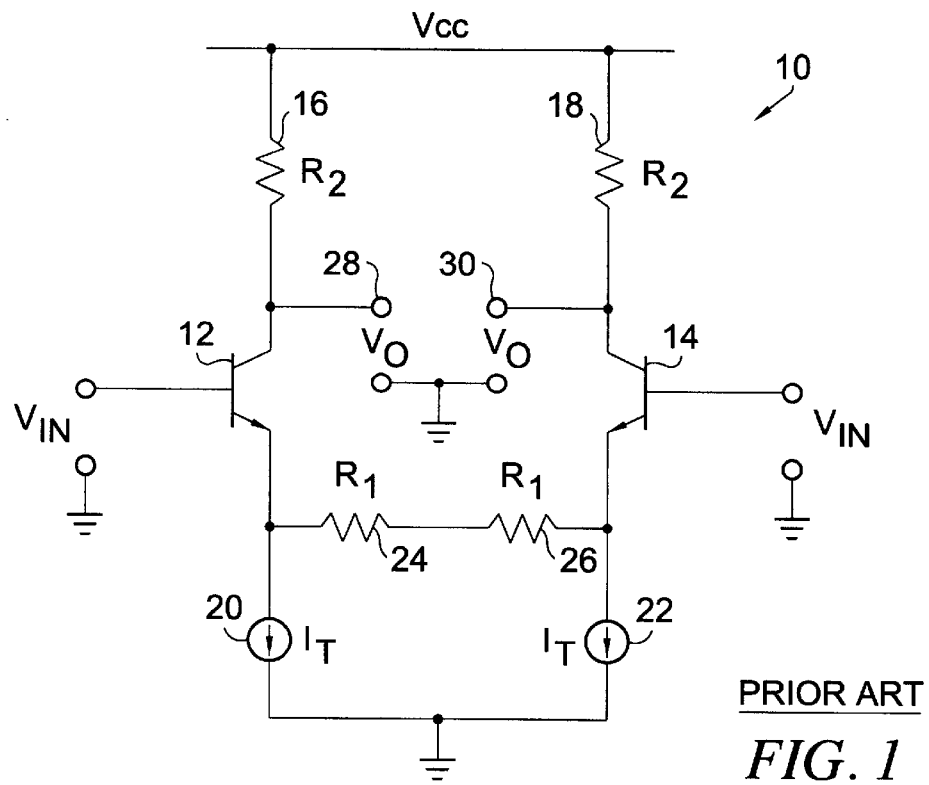
FIG. 1 is an electrical schematic diagram of a simple bipolar differential pair gain stage for high speed applications, in accordance with the prior art.
Figure 2:
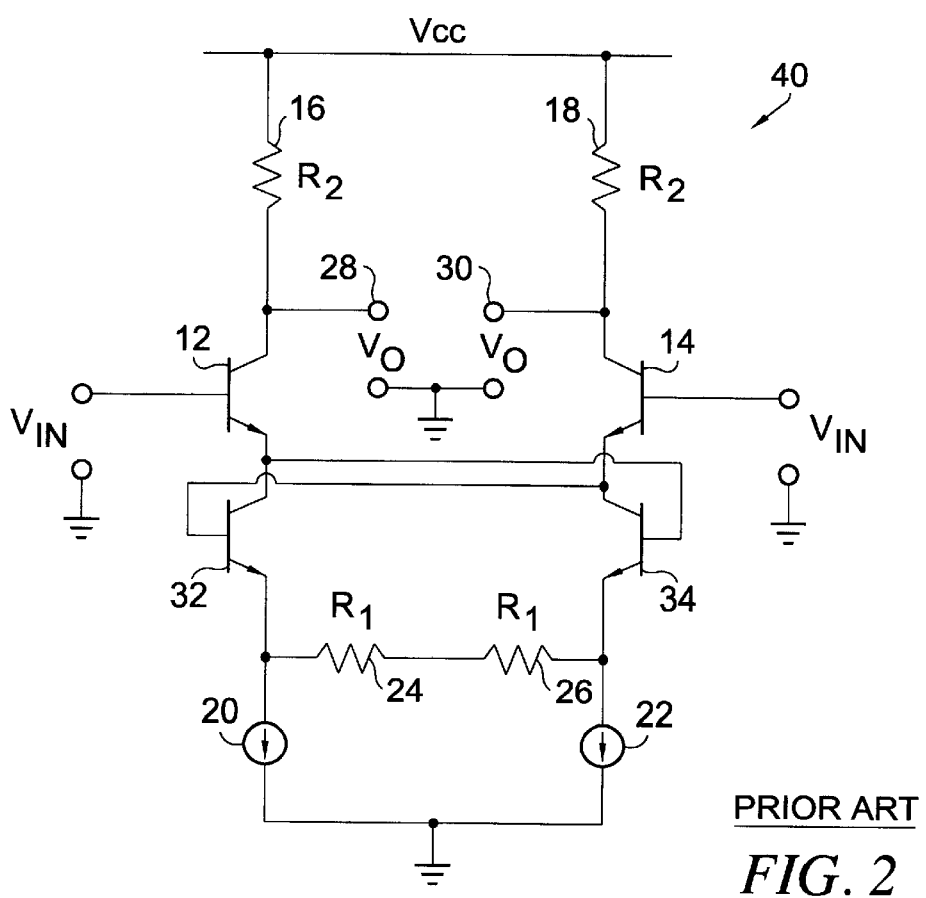
FIG. 2 is an electrical schematic diagram of a voltage gain stage having cross-coupled differential pair transistors for temperature compensation, in accordance with the prior art.

As mentioned above, $I_T$ should be a PTAT based current source, which has a positive relationship between the current sourced and temperature. In order to fix the output quiescent voltage, a current with a positive temperature coefficient is added to the collector of each transistor. This is accomplished by an NTAT based current source, which has a negative current relationship with respect to temperature. In this way, a band-gap voltage drop will be obtained across R2. This is shown in FIG. 3, in which a circuit 50 is shown, in accordance with a preferred embodiment of the invention. Again the same reference numerals are used to denote similar parts to those in the circuit 10 of FIG. 1. In the circuit 50, two additional current sources 52 and 54 are included. The current sources 52 and 54 have the property that the current delivered is inversely proportional to temperature. Ideally, the current sources are $I_{NTAT}$ current sources. The current sources 52 and 54 are connected to the collectors of the transistors 12 and 14 and add current to the collectors of transistors 12 and 14 in inverse proportion to the temperature. This has the effect of providing essentially a band-gap voltage drop across the resistors 16 and 18.

The current sources 52 and 54, which may be identically constructed, can be constructed in a manner shown in FIG. 4a. The circuit includes an NPN transistor 60 in series with a current source 62, between $V_{CC}$ and ground. A second NPN transistor 64 is connected in series with a resistor 66 between an output line 68 and ground. Transistor 60 generates a stable or constant voltage of magnitude $V_{be}$ across resistor 66. $V_{be}$ decreases with temperature, resulting in an output current $I_o$, that also decreases with increasing temperature. A graph showing the negative relationship between $V_{be}$ and temperature is shown in FIG. 4b.

It should be noted that the circuit 50 (FIG. 3) has some potential disadvantages that should be considered in its design. Thus, for a given voltage drop across R2, only part of the total load current flows through each transistor; hence, the dynamic range is smaller than the uncompensated gain stage with similar output voltage level. In addition, the compensation current source may add extra loading capacitance at node $V_0$. In this case, in some environments, some care may need to be taken to minimize or compensate this extra capacitance.

Although the invention has been described and illustrated with a certain degree of particularity, it is understood that the present disclosure has been made only by way of example, and that numerous chances in the combination and arrangement of parts can be resorted to by those skilled in the art without departing from the spirit and scope of the invention, as hereinafter claimed.

What is claimed is:

1. A temperature compensated voltage gain stage, comprising:
    a first current path, including a first bipolar transistor, a first load resistor, and a first PTAT current source connected in series;
    a second current path including a second bipolar transistor, a second load resistor, and a second PTAT current source connected in series;
    a third resistor connected between said first and second current paths; and
    first and second current sources having a negative current to temperature relationship connected to supply current to respective said first and second current paths in proportion to temperature induced current changes in said first and second current paths.

2. The temperature compensated voltage gain stage of claim 1 wherein said first and second current sources provide a current to cancel temperature induced transconductances of said first and second transistors.

3. The temperature compensated voltage gain stage of claim 2 wherein said first and second current sources having a negative current to temperature relationship are NTAT current sources.

4. The temperature compensated voltage gain stage of claim 1 wherein said bipolar transistors are NPN transistors.

5. The temperature compensated voltage gain stage of claim 1 wherein said first and second current sources provide a current to produce a band-gap voltage on said load resistors.

6. A method for compensating for temperature induced current transconductance of a differential voltage gain stage of the type having first and second current paths, each containing a load resistor, a bipolar transistor, and a positive temperature varying current source, connected in series, and a resistor interconnecting said first and second current paths, comprising:
    injecting a current that varies negatively with temperature into each of said current paths.

7. The method of claim 6 wherein said first and second current sources provide a current to cancel temperature induced transconductances of said first and second transistors.

* * * * *